United States Patent
Dommann et al.

(10) Patent No.: US 6,203,637 B1
(45) Date of Patent: Mar. 20, 2001

(54) USE OF A CLEANING PROCESS, A CLEANING PROCESS, A CONNECTION PROCESS AND A WORKPIECE PAIR

(75) Inventors: Alex Dommann, Buchs; Christoph Benno Luechinger-Bautista, Kuessnacht am Rigi; Nicolino Onda, Zurich; Juergen Ramm, Sevelen; Heinrich Zimmerman, Werdenberg, all of (CH)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 09/172,598

(22) Filed: Oct. 15, 1998

Related U.S. Application Data

(63) Continuation-in-part of application No. PCT/CH97/00147, filed on Apr. 15, 1996.

(30) Foreign Application Priority Data

Apr. 15, 1996 (CH) .................................................. 948/96

(51) Int. Cl.[7] .................................................. B32B 31/16
(52) U.S. Cl. .......................................... 156/73.1; 228/110
(58) Field of Search .................................. 156/73.1, 73.2, 156/73.3, 580.1, 580.2; 228/1.1, 110.1, 111

(56) References Cited

U.S. PATENT DOCUMENTS

| 5,308,950 | 5/1994 | Ramm et al. .................. 219/121.43 |
| 5,336,326 | 8/1994 | Karner et al. .................. 118/723 HC |
| 5,384,018 | 1/1995 | Ramm et al. .................. 204/192.38 |
| 5,409,543 | 4/1995 | Panitz et al. .................. 134/2 |

FOREIGN PATENT DOCUMENTS

| 40 29 268 C2 | 3/1992 | (DE) . |
| 40 29 270 C1 | 4/1992 | (DE) . |
| 43 10 941 A1 | 12/1993 | (DE) . |
| 0 371 693 A1 | 6/1990 | (EP) . |
| 0 427 020 A2 | 5/1991 | (EP) . |
| 0 510 340 A1 | 10/1992 | (EP) . |
| 2 267 387 | 12/1993 | (GB) . |
| 2-140925 | 5/1990 | (JP) . |

*Primary Examiner*—James Sells
(74) *Attorney, Agent, or Firm*—Evenson, McKeown, Edwards & Lenahan, P.L.L.C.

(57) ABSTRACT

A method uses a treatment process for surfaces which subsequently are to be connected by bonding, gluing or molding. The surfaces are exposed to an atmosphere with activated hydrogen. The connection is made a process step for eliminating the conservation treatment. The surfaces can be subjected to a plasma discharge in an atmosphere containing hydrogen. The plasma discharge is operated by a cathode/anode path as a DC discharge, and using a thermionic cathode as the cathode. The workpiece to be stored in air comprises a connection, which by gluing, bonding or molding, is subjectable to substantially higher stress than an identical workpiece which is stored in an identical manner, this being determinable by essentially identical Auger diagrams.

37 Claims, 6 Drawing Sheets

USE OF A CLEANING PROCESS, A CLEANING PROCESS, A CONNECTION PROCESS AND A WORKPIECE PAIR

CROSS-REFERENCE TO RELATED APPLICATIONS

This application is a continuation-in-part of PCT application Ser. No. PCT/CH97/00147 and Swiss Application No. 948/96 filed on Apr. 14, 1997 and Apr. 15, 1996, respectively.

BACKGROUND AND SUMMARY OF THE INVENTION

This application claims the priority of Swiss application No. 948/96 and PCT/CH97/00147, filed Apr. 15, 1996 and Apr. 14, 1997, respectively, the disclosure of which are expressly incorporated by reference herein.

The present invention relates to a process treatment used for surfaces which are subsequently connected, to a cleaning process for such surfaces, to a connection process for such surfaces as well as to a workpiece pair and a workpiece stored in air during a defined time period.

Definitions:

Intimate "connection processes" are bonding (welding, soldering) as well as gluing. The surfaces may be metal surfaces, particularly Cu, Ni, Ag, Au, Pd, Si or plastic surfaces, for example, on an epoxy or ester basis. Such surfaces are often covered by oxides, nitrides or polyimides. The energy supply for the above-mentioned connections is basically of a thermal type, and the energy is supplied to the surfaces to be connected, for example, by means of heated tools, the Joule effect, UV radiation or preferably by ultrasound or by means of reaction energy when gluing.

"Passivation" or passivated: See *Römpp's Chemical Dictionary*, Franckh'sche Verlagshandlung Stuttgart, Edition 8, Page 3005. It is a bonded protective covering of the basic body surface. The clean basic body surface is protected from atmospheric air influences. This takes place, for example, by forming an oxide or nitride layer. For the establishment of a connection of the above-mentioned type, such a layer must first be opened up by energy which must be applied specifically for this purpose, for example, by applying higher temperatures than required for the actual bonding operation, or chemically, for example, by using a flux.

Conserving, which, in particular, requires no opening-up of the layer by additional energy during the bonding, differs fundamentally from the above-mentioned passivating. This conservation was recognized only in conjunction with and by way of the present invention which is used in a particularly advantageous manner when packaging integrated circuits.

During the so-called "packaging" of integrated circuits, several operations are distinguished which comprise a bonding of surfaces in the above-mentioned sense:

1. The individual integrated circuits are cut out of a silicon wafer and are applied to semiconductor system carriers (HLST) and are bonded with these (the so-called die bonding). The semiconductor system carrier surface is normally made of copper or of nickel, silver or gold or of a material on an epoxy basis, generally of a plastic material. Examples of such semiconductor system carriers are punched or etched metallic lead frames, ceramic substrates or ball grid array substrate carriers made of plastic. Hard soldering, soft soldering and gluing are used as bonding processes. In the case of flip chip solder processes, the integrated circuit is applied to a semiconductor system carrier by geometrically separated solder balls which are simultaneously used as an I/O-bonding.

2. Bonding the integrated circuits with contact support points on the semiconductor system carrier, as, for example, on the lead frame. The participating surfaces are metallic; for example, of Al, Au, Cu, Ni, Pd. Here, soldering or welding, particularly flux-free soldering or ultrasonic welding, are used as bonding techniques. This step is known as wire bonding.

3. Molding: In this process step, the circuits are molded by a molding material on the semiconductor system carriers, for example, the lead frames, after the wire bonding, the above-mentioned surfaces of the semiconductor system carriers and the integrated circuits participating with respect to the molding material.

Within the scope of a connection process for metallic surfaces, a cleaning process is known from EP-0 371 693, in which the surfaces, which subsequently are to be bonded in the above-mentioned sense only by the feeding of energy, are first exposed to a microwave plasma discharge in a hydrogen-containing vacuum atmosphere. Then, without an interruption of the vacuum, the provided solder layer is melted open by the plasma discharge for bonding the surfaces. Thus, by avoiding a contact with air, a contaminating surface coating, which would highly interfere with the subsequent bonding process, is avoided.

U.S. Pat. No. 5,409,543 describes the use of activated hydrogen for preparing a soldering operation. As a result, an oxide layer is opened up for the reaching-through of the soldering operation to the metal surface.

EP-A-0 427 020 describes a process which pickles, i.e, opens up a passive layer and oxide layer of joining partners by a preliminary high-frequency plasma treatment using a process gas. Gases or gas mixtures are used which, among others, consist of $O_2$, $H_2$, $Cl_2$, $N_2O$, $N_2$, $CF_4$, etc.

If the above-mentioned pickling does not take place, immediately before the soldering operation, the joining partners are stored in protective intermediate storage devices, for which suitable receptacles, which are subjected to a protective gas, are provided for preventing contamination.

With regard to a first aspect, the present invention is based on the recognition that the cleaning process of the above-mentioned type, in an atmosphere, preferably in a vacuum atmosphere, with activated hydrogen, always leads to a conservation of the surfaces with respect to air. This conservation even permits the storing of the surfaces after the "cleaning" and before their bonding, in air, without the occurrence of the above-mentioned disadvantages with respect to the capacity to be bonded. Qualitatively, the bonding which takes place subsequently is not worse than if it had been established directly in the vacuum of the cleaning step or, generally without exposing the surfaces to air.

Often cleaning processes to be carried out for surfaces to be subsequently bonded in the above-mentioned sense are limited by the capacity of the participating parts to be thermally stressed. This applies particularly, if one group of surfaces are surfaces of the above-mentioned integrated circuits.

All processes of the above-mentioned IC packaging are critical, particularly if, for reasons of cost, certain semiconductor system carrier materials are to be used. Organic semiconductor system carrier materials should not be exposed to high temperatures. In addition, there is the tendency that the number of electrical connections of the integrated circuits increases constantly, while the cross-section of the connection wires is simultaneously reduced, for which a high reproducibility of the individual connections must be ensured.

With regard to a second aspect, in addition to a high connection reproducibility, an object of the present invention is to efficiently generate activated hydrogen but to simultaneously minimize the, thermal stressing of the treated surfaces. This is achieved in that, when a plasma discharge is used for activating the hydrogen, this is preferably implemented as a low-voltage discharge. The hydrogen can also, however, be activated in a different manner, for example, by the radiation of a defined energy or wavelength, particularly by UV radiation.

Definition:

A "low-voltage discharge" is a plasma discharge in the case of which a DC discharge is carried out by way of a cathode/anode path, the cathode being operated as a thermionic cathode (hot cathode).

With regard to a third aspect, the present invention relates to a connection process in which the surfaces, which were previously preferably cleaned in a vacuum process and were conserved according to the present invention, are exposed to air before they are subjected to the above-mentioned connection process. It is understood that this results in a high manufacturing flexibility. A workpiece pairing and a workpiece makes this possible.

Reference can be made to the following documents which are merely background:

Research Disclosure 307 107, wherein, in connection with a hardening process, a hard layer is produced by the action of an electron beam upon a surface;

GB-2 131 619, according to which mechanically loaded electric contact surfaces of switching contacts and a plasma discharge, preferably a high-frequency plasma discharge, are provided in an atmosphere containing hydrogen, oxygen, sulfur hexafluoride, etc.;

S. Veprek, et al., "Recent Progress in the Restoration of Archeological Metallic Artifacts by Means of Low-Pressure Plasma Treatment", from *Plasma Chemistry and Plasma Processing*, Vol. 8, No. 4, 1988, according to which surfaces of archeological metallic findings are conserved in a plasma discharge in a hydrogen-containing atmosphere;

K. Pickering, et al., "Hydrogen Plasmas for Flux-Free Flip-Chip Solder Bonding", from J.Vac.Sci.Technol. A8(3), May/June 1990, American Vacuum Society, according to which Pb—Sn soldering takes place in an atmosphere containing a microwave plasma in hydrogen;

V. Zhukov, et al., "Coadsorption of Hydrogen and Potassium on Silver Single Crystal Surfaces" from Pergamon, Vacuum, Volume 47, Number 1, 1995, Elsevier Science Ltd., according to which it was determined that precious metal surfaces are passivated by hydrogen adsorption;

N. Koopman, et al., "Fluxless Soldering in Air and Nitrogen", from I.N., 1993 *Proceedings*, 43rd Electronic Components and Technology Conference (Cat. No. 93CH3205/2), *Proceedings of IEEE*, 43rd Electronic Components and Technology Conference (ECTC'93) Orlando, Jun. 1–4, 1993, in which oxides on a solder surface are changed to oxyfluorides. As a result, a high passivation is achieved with respect to air so that, before the reflow bonding, surfaces treated in this manner can be stored in air for up to a week.

BRIEF DESCRIPTION OF THE DRAWINGS

These and further objects, features and advantages of the present invention will become more apparent from the following detailed description of currently preferred embodiments when taken in conjunction with the accompanying drawings wherein.

DETAILED DESCRIPTION OF THE DRAWINGS

The cleaning process used for the conservation according to the present invention as well as the connection process according to the invention can, when carried out with a plasma activation of the hydrogen, basically be carried out in plasmas which are maintained at DC–, AC– to microwave frequencies, or are mixed, AC+DC.

However, preferably low-voltage arc discharges can be used for this purpose. Systems of the preferably used type are known, for example, from DE-OS 43 10 941 corresponding to U.S. Pat. No. 5,384,016; DE 40 29 270 corresponding to EP-478 909, and DE-4 029 268 corresponding to U.S. Pat. No. 5,336,326; and EP-510 340 corresponding to U.S. Pat. No. 5,308,950. These documents, which are listed only as examples, show all treatment chambers for workpieces while using low-voltage arc discharge. With respect to the construction of such treatment chambers, these documents are to form an integrated part of the present description and are thus incorporated herein by reference.

Figure 1:
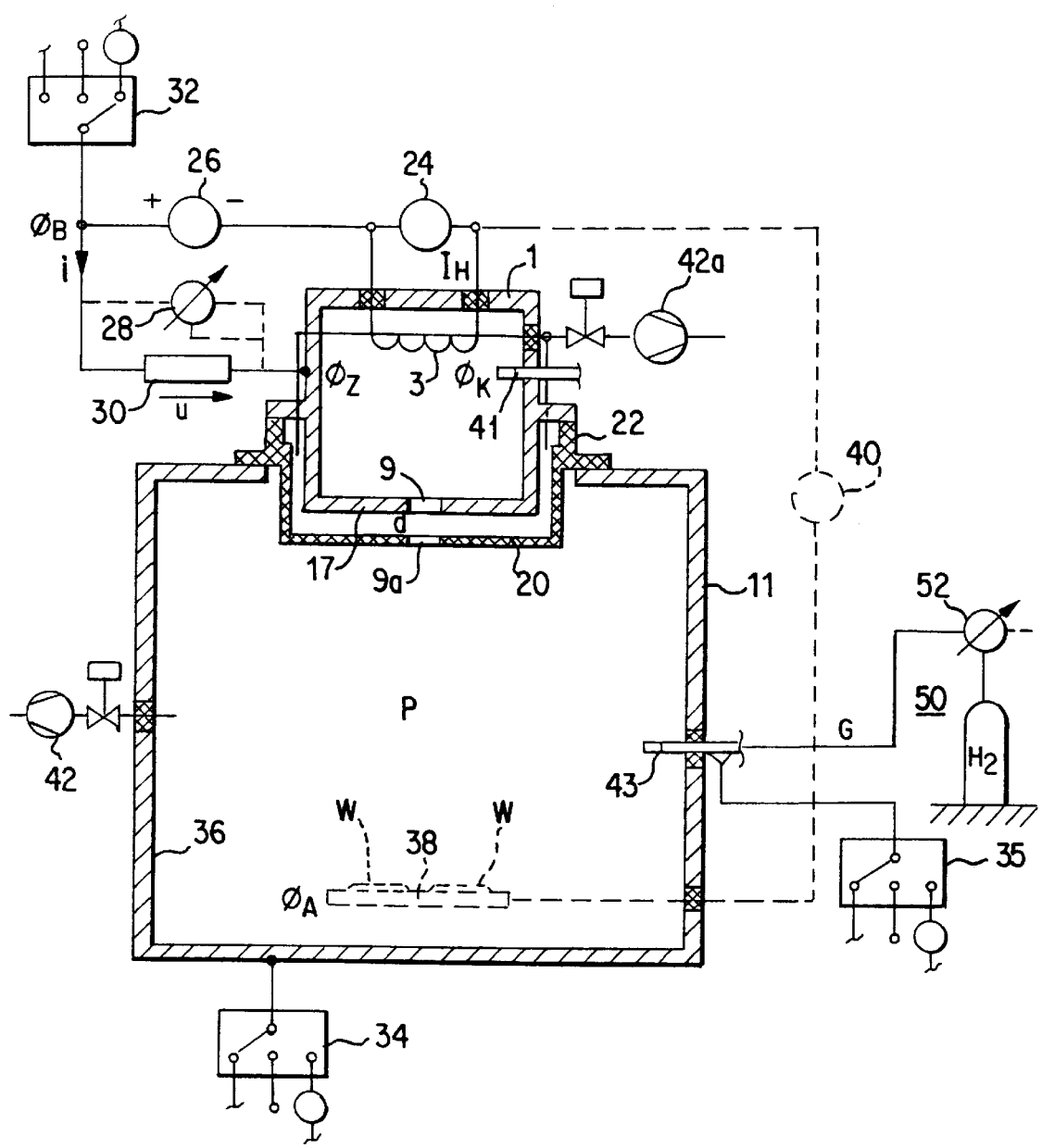
FIG. 1 is a schematic view of a system according to the present invention which was used for the hereinafter described tests.

FIG. 1 illustrates a presently preferred system for the use according to the present invention. A thermionic cathode 3 is mounted in an insulated manner in a cathode chamber 1. Portions 17 of the cathode chamber 1 frame an aperture 9. The cathode chamber 1 is mounted on the wall of the treatment chamber 11 by way of insulation carriers 22. A screen 20, which is operated in a potential-floating manner with respect to the cathode chamber 1 as well as with respect to the treatment chamber 11, surrounds the portions 17 at a darkroom distance d to directly into the area of the aperture 9. The thermionic cathode is operated by a source 24 with the heating current $I_H$ and is led by way of a voltage source 26 and a unit 28 to at least one portion of the cathode chamber wall, preferably onto the cathode chamber wall itself. The unit 28 acts as a current limiting device and causes a voltage drop u as a function of the current i flowing through it. As illustrated by a dash line, it may be implemented by a current-controlled voltage source, but is preferably implemented by a passive switching element, particularly by a resistance element 30.

The positive pole of the voltage source 26 can be connected to a reference potential, either mass or another defined potential, or may be operated in a potential-free manner, as illustrated purely schematically by the contingency switch 32. Likewise, the treatment chamber 11 is electrically insulated from the cathode chamber 1 and thus, as indicated purely schematically by way of the contingency switch 34, can be operated at ground potential, at a reference potential or optionally even in a potential-floating manner. The interior wall 36 of the treatment chamber 11 or at least portions thereof can be switched as an anode with respect to the thermionic cathode 3. However, as illustrated by the dash line, preferably a separate anode 38 is provided, which, by way of a voltage source 40, is anodically, that is, positively wired with respect to the thermionic cathode 3. In this case, the anode 38 is preferably used as a workpiece carrier for the schematically shown workpieces W. By way of a gas feeding line 41, a working gas, such as preferably argon, is supplied to the cathode chamber. By way of another schematically illustrated gas feeding line 43, as schematically illustrated by way of the contingency switch 35, being connect able to a potential depending on the potential connection of the chamber 11, the hydrogen-containing gas Ga preferably hydrogen, is supplied. The gas G is admitted through a schematically illustrated valve 52.

A pump arrangement 42 is provided in order to pump down the chamber 11 and optionally the cathode chamber 1, in which case, as illustrated, additionally a pump arrangement 42a may be provided in order to separately pump down the cathode chamber. The screen arrangement with the aperture 9 acts as a pressure stage between the pressure in the cathode chamber 1 and the pressure in the treatment chamber 11. A diluent gas, such as $N_2$, may be fed to the pump arrangement 42. Thus, a nitrogen flow can be generated which reduces or dilutes the hydrogen to less than 4% by volume in the gas, so that the gas can be discharged into the environment without reservations. There will no longer be any ignitable explosive gas.

The partial pressure of the hydrogen-containing gas G may be maintained to be significantly higher in the treatment chamber 11 than in the cathode chamber 1, which permits a significant increase of the life of the thermionic cathode 3. The wall of the cathode chamber 1 forms the initiating electrode: For igniting the low-voltage discharge, the thermionic cathode 3 is heated by the heat flow $I_H$ for the electron emission, and argon is admitted to the cathode chamber. On the basis of the distance relation between the wall of the cathode chamber 1 and the cathode 3, the ignition of the discharge takes place by the potential connection of the latter, whereupon a current i flows through the unit 28, particularly the resistance 30. Thus, the potential $\Phi_z$ of the cathode chamber wall 17 is reduced which previously was at the ignition value, whereby, during the operation, the wall of the chamber 1 acts as an anode only to a negligible extent and the primary discharge is pulled by the arrangement of the screen with the aperture 9 onto the treatment-chamberside anode 38.

The surfaces of the workpieces to be connected were treated by a chamber like the one illustrated in FIG. 1. These may, for example, be metallic lead frames for soft soldering, made, for example, of Cu, nickel-plated Cu, silver-plated Cu; organic semiconductor system carrier materials, such as BGA's (ball grid arrays) and (MCM's (multi-chip modules), for example, on an epoxy or ester basis, such as PCB's (printed chip boards); metallic QFP's (quad flat packs), for example, made of Cu, silver-plated Cu, Pd-plated Cu; the metallization of the strip conductors for the organic semiconductor system carrier materials and the QFP's, for example, made of silver-plated Cu, gold-plated Cu, Au; semiconductor substrate carriers constructed as flip chips with soldering points, for example, made of AgSn, PbSn, PbSnAg, PbInAg; semiconductor system carrier materials on a ceramic basis, such as aluminum oxide; surface protection layer of the chips, made, for example, of silicon nitride, silicon oxynitride, polyimide.

Description of Treatment:

The treatment chamber 11 according to FIG. 1, which was used for the tests to be described, had a volume of $$V=60 \text{ L}.$$

The workpieces W of the above-mentioned type were introduced into the chamber and the latter is operated as follows:

1. Pumping down to basic pressure of approximately $10^{-5}$ mbar;
2. Activation of the cathode 3 with $I_H$ approximately 150 A;

Switching-on of the gas flows:
   (a) Argon through line 41,
      flow $Fl_{Ar}$: 10 sccm$\leq Fl_{Ar} \leq$50 sccm,
   (b) hydrogen through line 43,
      flow $Fl_{H2}$: 10 sccm$\leq Fl_{H2} \leq$50 sccm.

3. After a heating-up time of approximately 10 seconds, ignition voltage was connected between the cathode 3 and the initiating electrode 17. The resistance 30 was selected to be approximately 20 Ω and was shunted to the ground. After the ignition of the discharge (ignition voltage approximately 20V to 30V), a discharge voltage between the cathode 3 and the anode 38 occurs of approximately 25V at a discharge current of 40 A, while preferably using a welding generator if the recipient wall 11 to the ground is used as the anode 38. Ions and activated neutrals are generated of which the typical plasma beaming is an indication. The workpieces to be treated were surface-treated in the thus-generated plasma. The hydrogen-volatile compounds with the contaminations were pumped out by the pump arrangement 42.

The working pressure amounted to:
approximately $6 \cdot 10^{-3}$ mbar.

In addition to holding the workpieces at the ground potential, the workpieces may also be exposed to the plasma treatment in a potential-floating manner or connected to a reference potential. Because the potential of the workpieces with respect to the ground potential in the above-described low-voltage discharge is very low (<30V), the problem of the redepositing of material on the workpieces, which occurs during the so-called sputtering, as well as also, in particular, the risk of the destruction of ICs, which are critical with respect to electric potential differences, is excluded. The cleaning and conservation takes place only by way of chemical processes and is caused either by electrons, in the case of correspondingly potential-connected workpieces, or by low-energetic ions and electrons in the case of floatingly-operated workpieces.

The large number of electrons coupled into the plasma ensures a high reactivity of the plasma and therefore short treatment times, which contributes significantly to the economic efficiency of the suggested approach. Another advantage of this process is the fact that the plasma can penetrate even into small hollow spaces. As a result, for example, workpieces can even be treated without being removed from corresponding cassettes or magazines, which is particularly economical.

Figure 2A:
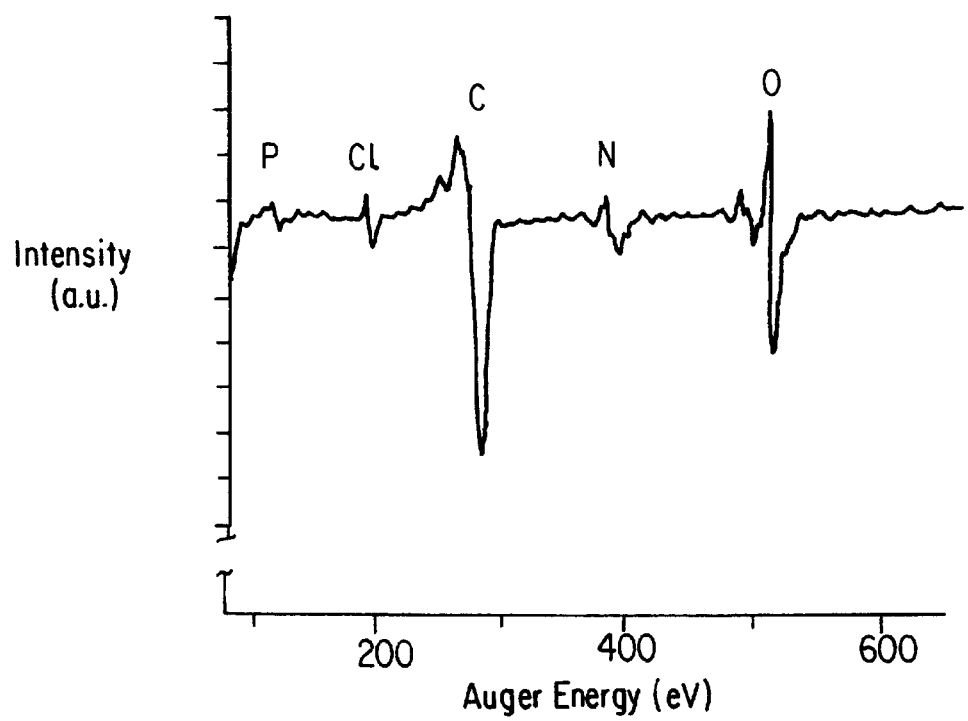
FIG. 2 is a view of the Auger spectrums of two lead frame surfaces of soft solder substrates which originate from the same packaging unit and within which had different distances from the packaging material.
Figure 2B:
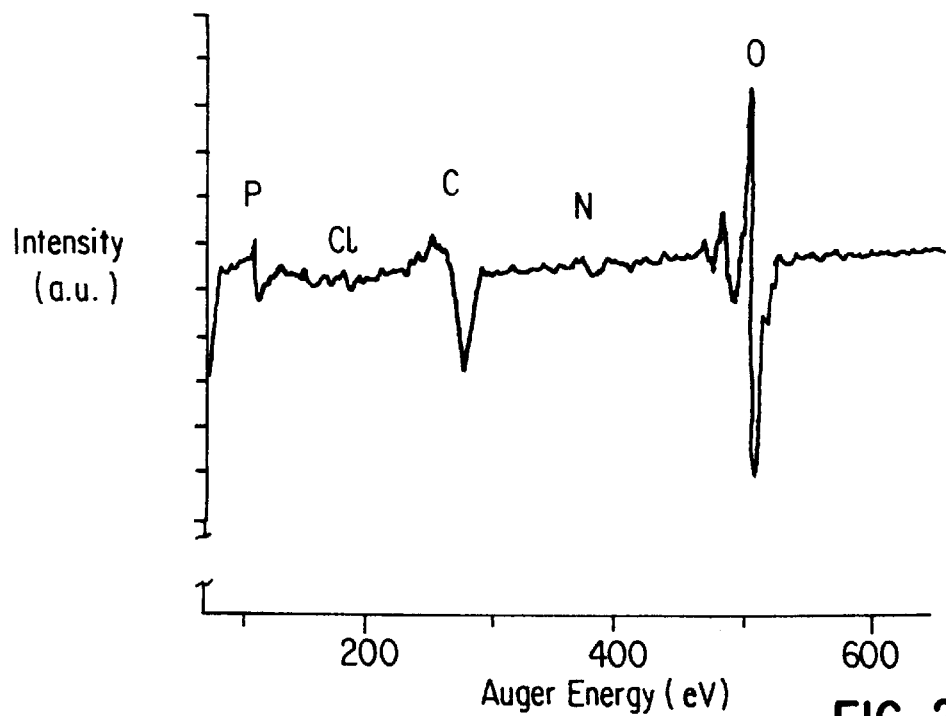

Results:

FIG. 2 illustrates Auger diagrams (a) of an untreated lead frame copper surface for a soft-solder bonding after the connection with a packing material;

(b) of such a surface within the same packaging unit but not in contact with the packaging material.

The lead frame surface which was in contact with the packaging material (b) is virtually unsolderable because of its high contamination.

Figure 3A:
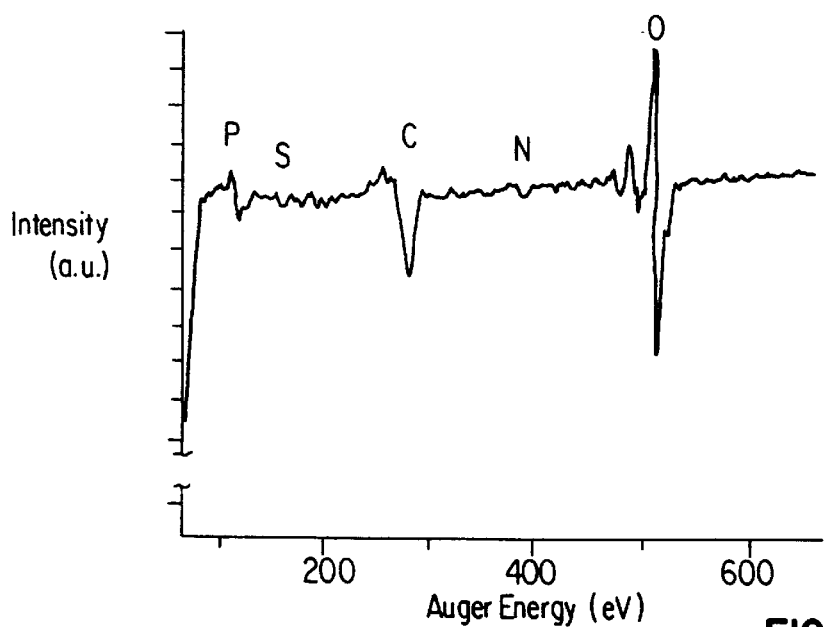
FIG. 3 is a view of the Auger spectrums of surfaces for the establishment of a soft solder connection, in an unpretreated state (a), pretreated according to the invention (b) as well as pretreated according to the present invention and then exposed to air (c)
Figure 3B:
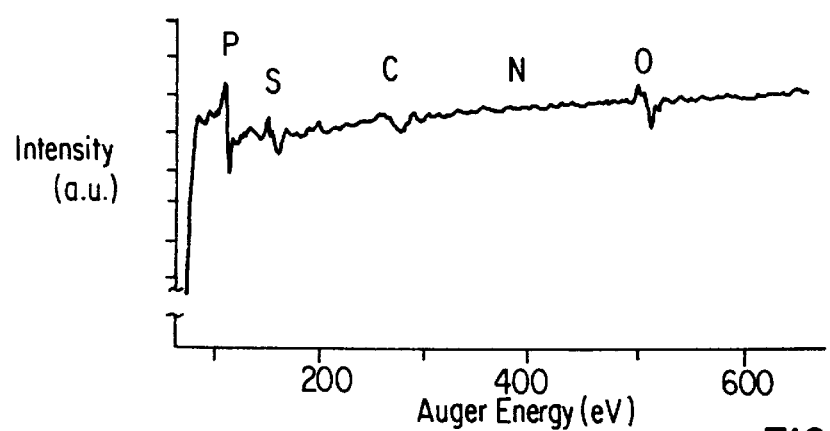

FIG. 3 shows Auger diagrams of (a) untreated lead frame surfaces for a soft-solder bonding;

(b) such surfaces treated according to the above-described approach immediately after their treatment; and (c) such surfaces according to curve (b) but after their storage for approximately 1 hour or more in air.

The Auger diagrams illustrate that untreated surfaces, on one hand, and treated surfaces which were then exposed to air, on the other hand, hardly differ from one another.

Although, as illustrated in FIG. 3, the Auger diagrams of uncleaned metal surfaces and metal surfaces cleaned according to the above-mentioned process and then exposed to air again hardly differ from one another, in the case of the latter, the solder wets the lead frame surfaces much better than in the case of uncleaned lead frames, which leads to a more intimate bonding between the semiconductor and the carrier. Quantitatively, this cleaning effect can be illustrated particularly clearly by the good stress results in the case of wire bonding.

Figure 4:
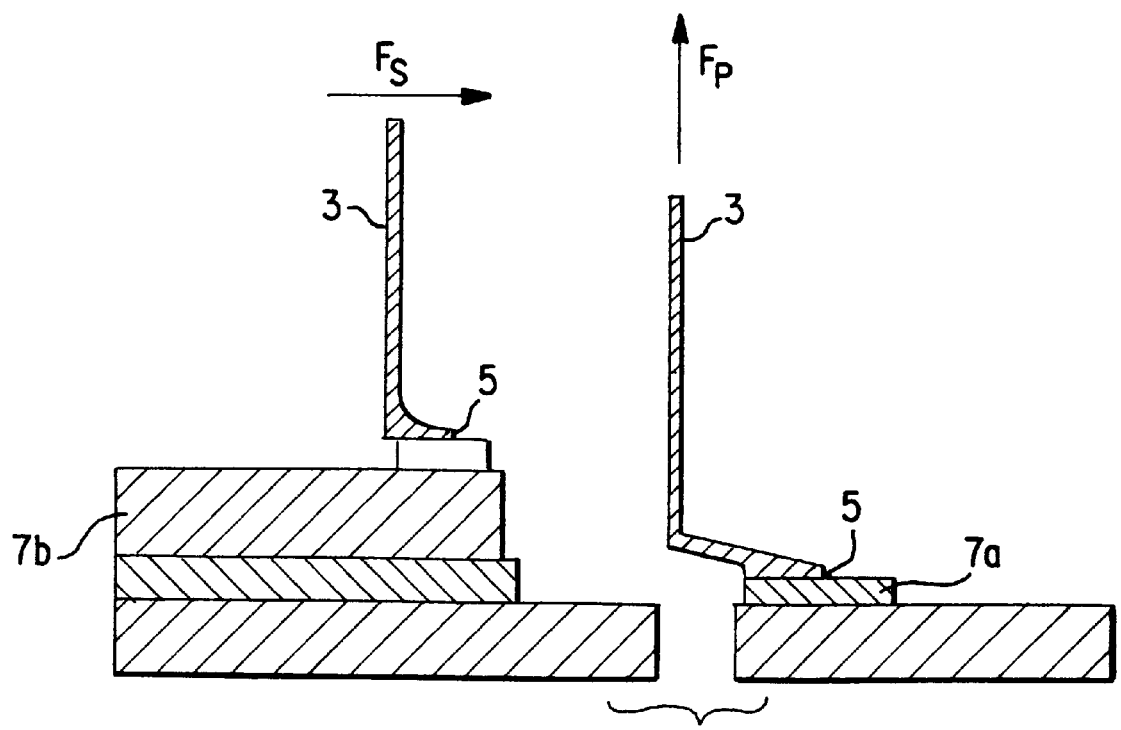
FIG. 4 is a schematic view of the definition of the shearing stress and of the tensile load of wire-bond connection points.

FIG. 4 defines the testing stress for wire bonding. The stressing $F_S$ of a thin wire 3, whose surface is bonded at a connection point 5 with the surface of a lead frame 7a or chip 7b, is called a shearing stress, while the stressing $F_P$ is called a tensile stress.

Further, untreated surfaces of QFP lead frames with silver-plated Cu leads were wire-bonded analogously to (a) of FIG. 3, and such treated surfaces were bonded according to (c) of FIG. 3 were wire-bonded.

Figure 6:
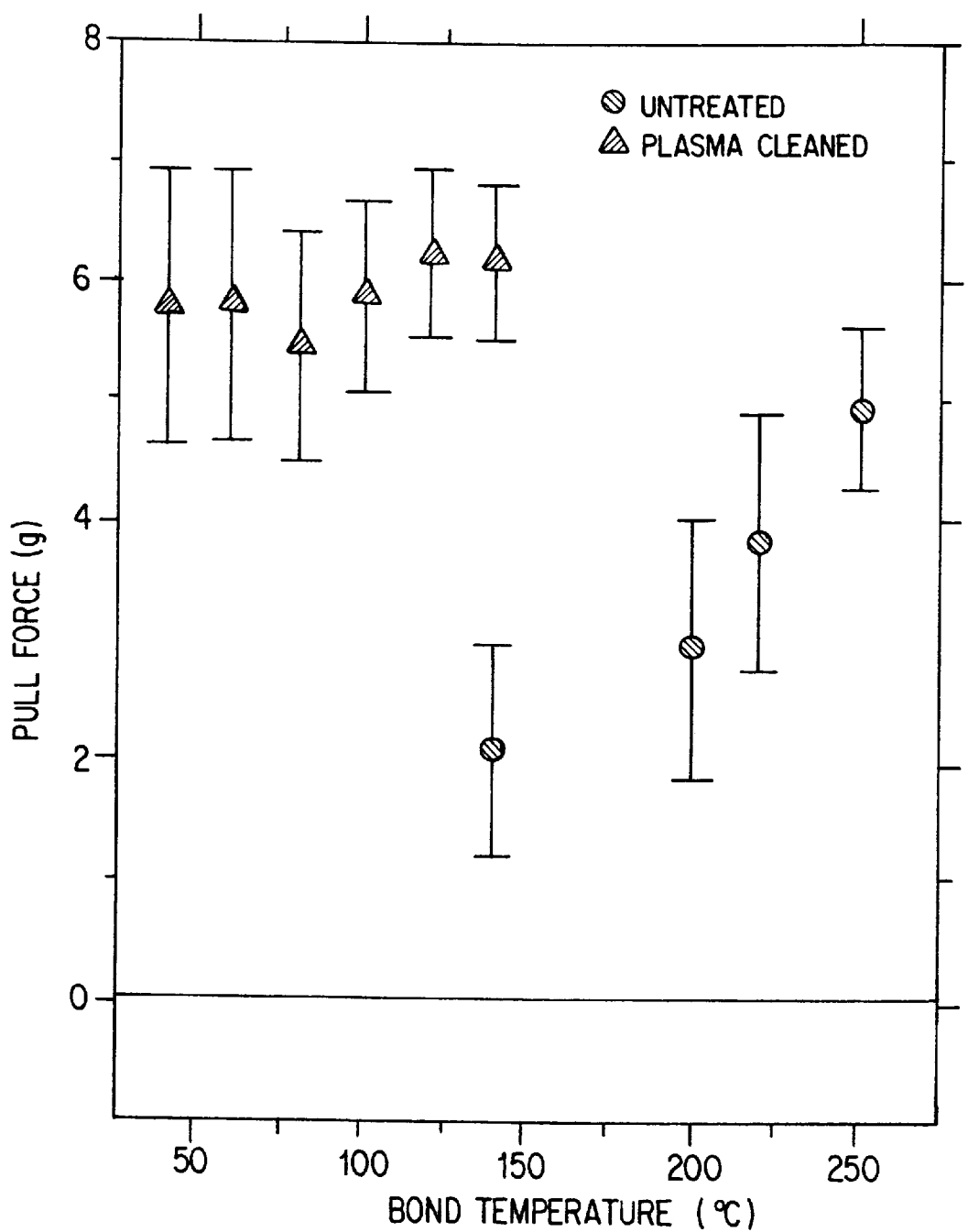
FIG. 6 is a graph of the tensile loadability of ultrasonically bonded, not pretreated surfaces as well as of surfaces pretreated according to the present invention and stored, as a function of the bond temperature.

As bonding parameters, an ultrasound frequency of 100 kHz and a bonding temperature of approximately 150° C. were used (see also FIG. 6).

Figure 5:
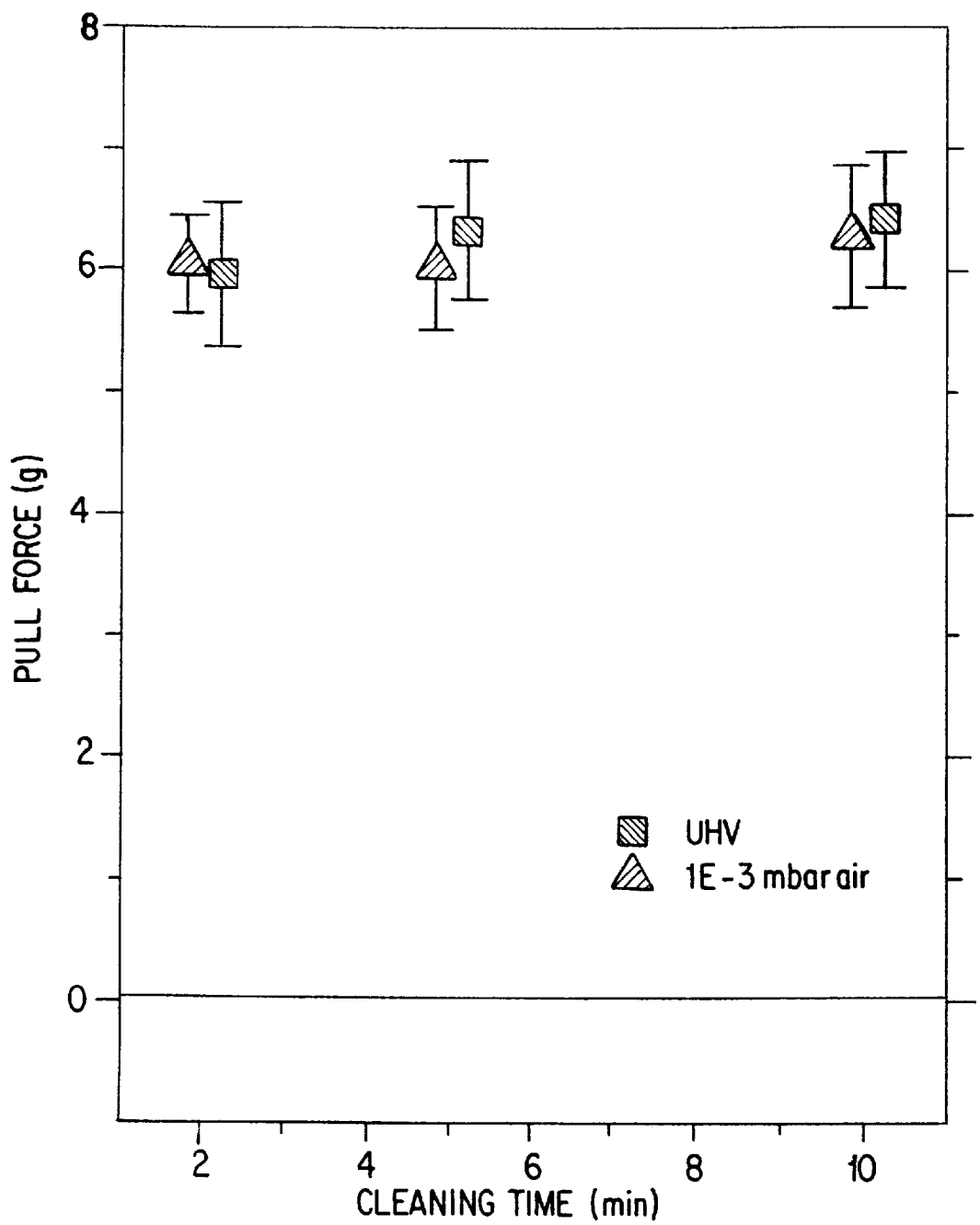
FIG. 5 is a graph of the tensile loadability of surfaces of QFP (quad flat pack) Cu lead frames with silver-plated leads which are treated according to the invention, stored in air and then ultrasonically wire-bonded, as a function of the treatment time of surfaces to be connected according to the invention for wire bonding as well as a function of the pressure during the surface treatment according to the invention.

While, at these low temperatures, the surfaces according to (a) of FIG. 3 were virtually unbondable, tensile stressabilities according to FIG. 5 were obtained for the surfaces according to (c) of FIG. 3, as a function of the treatment time in the plasma and the initial pressure to which the treatment chamber according to FIG. 1 was pumped down before letting in the gas. This illustrates that the stressability rises only insignificantly as the treatment time increases, whereby even very short treatment times of 2 minutes or less exhibit excellent results.

With respect to the initial pressure, even a pressure increase to, for example, $10^{-3}$ mbar is shown to affect the tensile stressability only insignificantly, thereby reducing the expenditures for the used system for ultra high vacuum pumps.

FIG. 6 illustrates the tensile stressabilities of the ultrasonically bonded surfaces according to (c) of FIG. 3, as a function of the bonding temperature which was so high that also the untreated surfaces according to (a) of FIG. 3 became bondable. On one hand, significantly lower bonding temperatures are shown to be sufficient for the surfaces treated according to the present invention for achieving much higher tensile stressabilities, compared with untreated identical workpiece surfaces.

Furthermore, the bonding quality of the surfaces treated according to the present invention is largely independent of the temperature, which significantly reduces the expenditures for controlling the temperature during the bonding. The fact that low bonding temperatures can be used according to the present invention is particularly important, for example, for ball grid array semiconductor system carriers made of an organic material which must be bonded at low temperatures of $\leq 150°$ C.

The bonding temperatures which can be used according to the invention in FIG. 6 are significantly lower than the bonding temperatures which are normally used. Currently, it can only be guessed that the treatment according to the present invention causes the conservation in that the metal surface is saturated by hydrogen, that contaminations are precipitated on the surface and virtually float on the hydrogen covering so that their characteristics appear in the Auger diagram, in which hydrogen cannot be detected or can be detected only indirectly and with difficulty, after being exposed to air, virtually as if they were not cleaned but, for the bonding or connecting, as if they were subjected to a high-quality cleaning. When supplying connecting energy, such as ultrasound during bonding, the conserving hydrogen connections are obviously slightly broken open and the pure metal surface is exposed for the bonding.

Figure 3C:
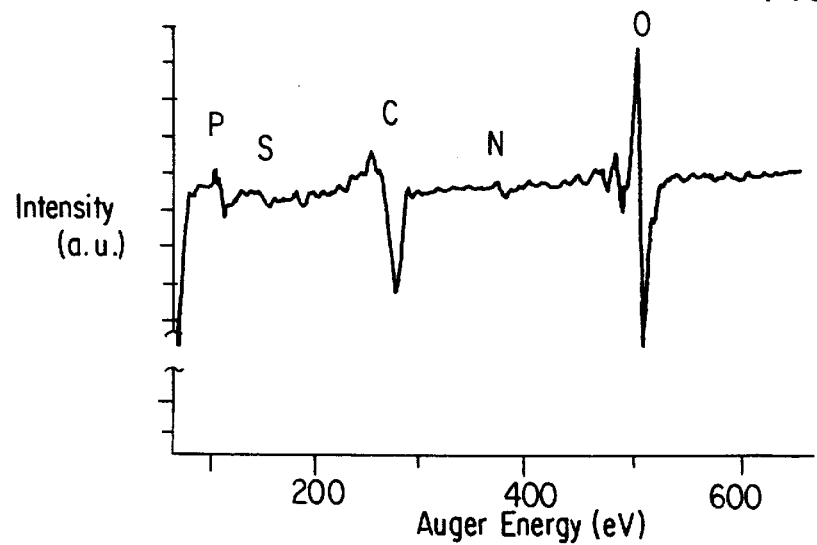

The diagram according to FIG. 3(c), together with the high-quality connectability according to FIGS. 5 and 6, characterize the surface pairs according to the invention in contrast to pairs according to FIG. 3(a) and their poor connectability according to FIG. 6.

Uncleaned semiconductor system carriers exhibited tensile stressing values of the bonded wires of less than 5 cN, while values of above 6 cN could be observed for those which were surface-treated according to the present invention. In most cases, the wire tore before there was a tearing of the connection point.

Furthermore, the surface treatment in activated hydrogen has been discovered to have an extremely favorable effect for the connections to be established also for the other above-mentioned steps during the packaging process of integrated circuits. Also in semiconductor system carrier materials on a plastic basis, it was found that, after the molding, the molded mass adheres only insufficiently to the semiconductor system carrier, but according to the pretreatment according to the present invention in activated hydrogen, particularly in plasma-activated hydrogen, an intimate bonding is achieved of the molded mass and the semiconductor system carrier surface cleaned in activated hydrogen. Here also, the conservation effect of the treatment with activated hydrogen can be observed. That is, the treated semiconductor system carriers can still be excellently bonded and molded several days, for example, five days, after the cleaning.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of making a device comprising:
   exposing a first surface of a first part to an atmosphere of activated hydrogen for generating a hydrogen covering on the first surface, subsequently exposing the first surface to air, and bonding a second surface of a second part to the first surface without any further treatment of the first surface after the step of exposing the first surface to air.

2. A method according to claim 1, wherein said bonding includes ultrasonic welding of said first and second surfaces together.

3. A method according to claim 1, wherein said bonding includes forming a solder connection of said first and second surfaces.

4. A method according to claim 1, wherein said bonding includes gluing said first and second surfaces together.

5. A method according to claim 1, wherein said exposing the first surface to an atmosphere of actuated hydrogen includes placing said first part in a low pressure chamber and then generating a plasma discharge in the chamber.

6. A method according to claim 5, wherein said generating a plasma discharge is carried out with a low voltage discharge of less than 30 volts.

7. A method according to claim 1, wherein said exposing the first surface to an atmosphere of activated hydrogen includes activating hydrogen by ultraviolet radiation.

8. A method according to claim 1, wherein said step of exposing the first surface to activated hydrogen is carried out in less than two minutes.

9. A method according to claim 1, wherein the first and second surfaces are metallic.

10. A method according to claim 1, wherein said first part is a metallic coated lead frame.

11. A method according to claim 1, wherein said first part is an organic semiconductor system carrier material.

12. A method according to claim 11, wherein said first part is part of a ball grid array.

13. A method according to claim 11, wherein said first part is part of a multi-chip module.

14. A method according to claim 11, wherein said first part is part of a printed chipboard.

15. A method according to claim 1, wherein said first part is a metallic quad flat pack.

16. A method according to claim 1, wherein said first part is a semiconductor substrate carrier constructed of flip chips with soldering points.

17. A method according to claim 1, wherein said first part is a semiconductor system carrier made of ceramic and coated with a surface protection layer forming said first surface.

18. A method according to claim 1, wherein said first part is a lead frame and said first surface is a copper surface.

19. A method according to claim 18, wherein said exposing the first surface to an atmosphere of actuated hydrogen includes placing said first part in a low pressure chamber and then generating a plasma discharge in the chamber.

20. A method according to claim 19, wherein said bonding includes soft soldering of the first surface to the second surface.

21. A method according to claim 20, wherein the second part is a wire.

22. A method according to claim 1, wherein the first part is a semiconductor system carrier and the second part is a molded plastic mass.

23. A method according to claim 1, wherein said bonding is performed at low temperatures below 150° C.

24. A method according to claim 12, wherein said bonding is performed at low temperatures below 150° C.

25. A method according to claim 1, wherein the surfaces are one of metallic, metalloid and plastic surfaces.

26. A method according to claim 1, wherein said bonding is performed more than one day after the exposing the first surface to air.

27. A method according to claim 6, wherein a discharge current of the plasma discharge is between 10 and 100 amps.

28. A method according to claim 1, wherein said first and second parts form an integrated circuit and semiconductor system carrier assembly.

29. A method according to claim 1, wherein said first surface is formed of one of aluminum, gold, copper, and nickel.

30. A method according to claim 28, wherein said first surface is formed of one of aluminum, gold, copper, and nickel.

31. A method according to claim 28, wherein said bonding includes ultrasonic welding of said first and second surfaces together.

32. A method according to claim 28, wherein said bonding includes forming a solder connection of said first and second surfaces.

33. A method according to claim 28, wherein said bonding includes gluing said first and second surfaces together.

34. A method according to claim 31, wherein said exposing the first surface to an atmosphere of actuated hydrogen includes placing said first part in a low pressure chamber and then generating a plasma discharge in the chamber.

35. A method according to claim 28, wherein said generating a plasma discharge is carried out with a low voltage discharge of less than 30 volts.

36. A method according to claim 7, wherein said exposing the first surface to an atmosphere of activated hydrogen includes activating hydrogen by ultraviolet radiation.

37. A method according to claim 28, wherein said step of exposing the first surface to activated hydrogen is carried out in less than two minutes.

* * * * *